(12) United States Patent
Bechtel et al.

(10) Patent No.: US 8,040,045 B2
(45) Date of Patent: Oct. 18, 2011

(54) ELECTROLUMINESCENT LIGHT SOURCE

(75) Inventors: Hans-Helmut Bechtel, Roetgen (DE); Wolfgang Busselt, Roetgen (DE); Peter Schmidt, Aachen (DE); Joerg Meyer, Aachen (DE); Herbert Friedrich Boerner, Aachen (DE); Stefan Peter Grabowski, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 700 days.

(21) Appl. No.: 11/995,349

(22) PCT Filed: Jul. 6, 2006

(86) PCT No.: PCT/IB2006/052272
§ 371 (c)(1),
(2), (4) Date: Jan. 11, 2008

(87) PCT Pub. No.: WO2007/007240
PCT Pub. Date: Jan. 18, 2007

(65) Prior Publication Data
US 2008/0191615 A1     Aug. 14, 2008

(30) Foreign Application Priority Data

Jul. 14, 2005 (EP) .................................... 05106448

(51) Int. Cl.
H01J 1/62      (2006.01)
H01J 63/04     (2006.01)

(52) U.S. Cl. ........ 313/504; 313/501; 313/503; 313/506; 313/512

(58) Field of Classification Search .................. 313/504, 313/506, 501, 503, 505, 512
See application file for complete search history.

(56) References Cited

U.S. PATENT DOCUMENTS

| 6,084,347 | A  | * | 7/2000  | Xu et al. ..................... 313/503 |
| 6,137,459 | A  | * | 10/2000 | Eida et al. ..................... 345/76 |
| 6,249,372 | B1 | * | 6/2001  | Kobayashi et al. ........... 359/326 |
| 6,309,486 | B1 | * | 10/2001 | Kawaguchi et al. ............ 156/67 |
| 6,358,652 | B1 | * | 3/2002  | Tomiuchi et al. ................. 430/7 |
| 6,513,949 | B1 |   | 2/2003  | Marshall et al. |

(Continued)

FOREIGN PATENT DOCUMENTS
EP    1473784 A2    11/2004
(Continued)

OTHER PUBLICATIONS

S. R. Forest et al: "Efficient Organic Light Emitting Diodes and Photodetectors", Technical Digest—International Electron Devices Meeting, 2001, pp. 165-166.

(Continued)

*Primary Examiner* — Nimeshkumar Patel
*Assistant Examiner* — Thomas A Hollweg
(74) *Attorney, Agent, or Firm* — Thorne & Halajian, LLP

(57) ABSTRACT

An organic electroluminescent light source has at least one substrate and layers that are arranged on the substrate. The layers include electrodes of which at least one electrode is transparent and one acts as an anode and one as a cathode, and at least one organic electroluminescent layer that is arranged between the electrodes. The organic electroluminescent layer has regions that emit blue light and/or green light, and at least one phosphor layer that is arranged in the beam path of the light leaving the organic electroluminescent light source and that partly covers the electroluminescent layer.

15 Claims, 3 Drawing Sheets

U.S. PATENT DOCUMENTS

| | | | |
|---|---|---|---|
| 6,563,263 B1 | 5/2003 | Kawaguchi et al. | |
| 6,700,322 B1* | 3/2004 | Duggal et al. | 313/504 |
| 6,771,019 B1* | 8/2004 | Wu et al. | 313/503 |
| 6,847,162 B2* | 1/2005 | Duggal et al. | 313/504 |
| 6,891,326 B2* | 5/2005 | Lu | 313/504 |
| 2002/0190661 A1 | 12/2002 | Duggal et al. | |
| 2003/0127968 A1* | 7/2003 | Kuma et al. | 313/503 |
| 2004/0056990 A1* | 3/2004 | Setlur et al. | 349/69 |
| 2004/0119400 A1* | 6/2004 | Takahashi et al. | 313/504 |
| 2004/0169622 A1* | 9/2004 | Matsuura et al. | 345/76 |
| 2004/0202850 A1* | 10/2004 | Hayashi et al. | 428/212 |
| 2004/0217693 A1* | 11/2004 | Duggal et al. | 313/504 |
| 2004/0262576 A1 | 12/2004 | Thompson et al. | |
| 2005/0116619 A1* | 6/2005 | Kuma et al. | 313/503 |
| 2005/0189857 A1* | 9/2005 | Kobori | 313/110 |
| 2006/0170336 A1* | 8/2006 | Ono et al. | 313/504 |

FOREIGN PATENT DOCUMENTS

| | | |
|---|---|---|
| EP | 1111966 A3 | 4/2006 |
| JP | 10022073 | 1/1998 |

OTHER PUBLICATIONS

Chihaya Adachi et al; "Nearly 100% Internal Phosphorescence Efficency in an Organic Light Emitting Device", Journal of Applied Physics, vol. 90, No. 10, Nov. 15, 2001.

M. A. Baldo et al; "Phosphorescent Materials Forapplication to Organic Light Emitting Devices", Pure Appl. Chem.,vol. 71,No. 11, pp. 2095-2106, 1999.

* cited by examiner

|     | LQ1  | LQ2  | LQ3  | LQ4  | LQ5  |
|-----|------|------|------|------|------|
| CCT | 5585 | 4037 | 3236 | 2886 | 2400 |
| CRI |      |      |      |      |      |
| R1  | 89   | 90   | 92   | 94   | 87   |
| R2  | 94   | 97   | 99   | 96   | 98   |
| R3  | 91   | 95   | 94   | 86   | 84   |
| R4  | 80   | 86   | 89   | 89   | 81   |
| R5  | 87   | 90   | 92   | 95   | 89   |
| R6  | 97   | 98   | 96   | 89   | 91   |
| R7  | 84   | 87   | 86   | 81   | 76   |
| R8  | 74   | 73   | 73   | 69   | 57   |
| R9  | 37   | 37   | 41   | 41   | 20   |
| R10 | 90   | 93   | 98   | 91   | 97   |
| R11 | 84   | 89   | 92   | 92   | 84   |
| R12 | 69   | 75   | 79   | 78   | 81   |
| R13 | 90   | 93   | 95   | 98   | 91   |
| R14 | 94   | 97   | 97   | 93   | 92   |
| Ra  | 87   | 89   | 90   | 87   | 83   |

FIG. 5

ELECTROLUMINESCENT LIGHT SOURCE

The invention relates to an organic electroluminescent light source (an OLED) for emitting white light. Organic LED's are non-metallic, or hybrid organometallic, compounds whose emission is generated either at discrete molecules (LMW) or at polymer chains (PLED).

At the present time development is focused particularly on large-area light sources and on ones that emit white light.

The conversion of light, i.e. the absorption of light of one wavelength and the subsequent re-emission of light of a longer wavelength, by means of phosphor particles is known.

For example, in 2004 the research department of General Electric presented an organic electroluminescent light source that, for a size of 610×610 mm, achieved an efficiency of 15 lumens per watt and a total luminous flux of 1200 lumens.

This organic luminescent light source comprises a blue-emitting OLED (polymer) on a substrate having, on its opposite side, a phosphor coating for the partial conversion of the light into yellow light (YAG:Ce) and red light (organic phosphor).

In this solution, which is shown schematically in FIG. 1, a blue-emitting OLED 2, comprising a system of layers 21 and a transparent substrate 22, is covered with a phosphor layer 3 that converts blue light partly into yellow and/or red and green light. In this way, the light that is emitted or put out by the organic electroluminescent light source is, as a whole, white. However, in contrast to what applies in the case of inorganic LED's, blue-emitting OLED's are considerably less efficient and less stable than green-emitting and red-emitting OLED's.

It is an object of the invention to provide an organic electroluminescent light source for emitting white light that is notable for having a long life and improved efficiency. The organic electroluminescent light source is also intended to be capable of being produced effectively in the context of industrial production.

It is essential to the invention that the organic electroluminescent light source according to the invention has at least one organic electroluminescent layer that is arranged between the electrodes, the organic electroluminescent layer having a plurality of regions that emit either blue light or green light and having at least one phosphor layer that is arranged in the beam path of the light leaving the organic electroluminescent light source and that partly covers the electroluminescent layer.

This makes it possible for the color and what is termed the color temperature of the light leaving the organic electroluminescent light source to be selected or varied by an appropriate design for the different emitting regions of the OLED or by driving the said regions electrically in the appropriate way. Also, improved quantum efficiency and an improved life are achieved by the use of green emitters, because the latter are significantly better than blue or red emitters in these respects.

The phosphor layer is so designed that green light is at least partly converted into red light. The phosphor layer, which may comprise one phosphor material or a mixture of a plurality of phosphor materials, is applied in the usual way by printing or photolithographic processes.

The phosphors that may be considered as phosphors able to be used within the scope of the invention are all materials that absorb in the green region of the spectrum (in the emission region of the green emitters).

An electroluminescent light source generally comprises a layered structure that is applied to a plane, transparent substrate (glass or polymer) and that comprises an organic or non-organic electroluminescent layer (EL layer) that is arranged between an anode and a cathode. The EL layer may be constructed from a plurality of sub-layers in this case. Arranged between the cathode and the EL layer there may, in addition, be an electron injection layer made of a material having a low work function.

Arranged between the anode and the EL layer there may, in addition, be a hole transport layer. Depending on the direction in which the emitted light is coupled out (bottom emitter: emission through the substrate; top emitter: emission away from the substrate, through a transparent cathode for example), either the cathode or the anode is composed of a reflective material. The reflective anode may either itself be reflective in this case or may have, in addition, a reflective layered structure. In line with this, the other electrode is made of a transparent material.

It is preferable for the phosphor layer to at least partly cover those regions of the organic electroluminescent layer that emit green light.

This makes it possible for a lamp to be produced that has blue-green-yellow regions or blue-green-red regions. In the latter case, the phosphor layer converts the green emission from the OLED wholly or partly into red light, depending on the thickness of the phosphor layer.

It is also preferable for the green-emitting layer to contain iridium(III) and in particular bis(2-phenylpyridine)iridium (III)acetylacetonate [(ppy)2Ir(acac)]. This green emitter achieves an efficiency of approx. 60 lm/W, at an internal quantum yield of approx. 87%, in for example a host material that is suitable in this respect.

In a preferred embodiment, the light source is divided into separately addressable elements. What can be achieved in this way is an area that, as a whole, emits light uniformly but whose color, or color temperature in the case of white light, can be changed. What is more, the separately addressable elements can be used to represent items of information.

It is preferable for the green-emitting regions of the OLED light source to be divided into at least two regions that can be driven separately, and for the phosphor layers that cover the at least two regions to differ in their thickness and/or in the phosphor material used. This makes it possible for the color temperature to be varied within wide ranges without the standard of color rendering being adversely affected. What is more, not only can white light be generated with an arrangement of this kind but it is also possible for different colors contained in the color space preset by the separately driven regions to be generated.

These and other aspects of the invention are apparent from and will be elucidated with reference to the embodiments described hereinafter.

In the drawings:

FIG. 5 shows the correlated color temperatures (CCT) and color rendering indexes (CR1) for the lamp spectrums LQ1 to LQ5 shown in FIG. 4

Figure 1:
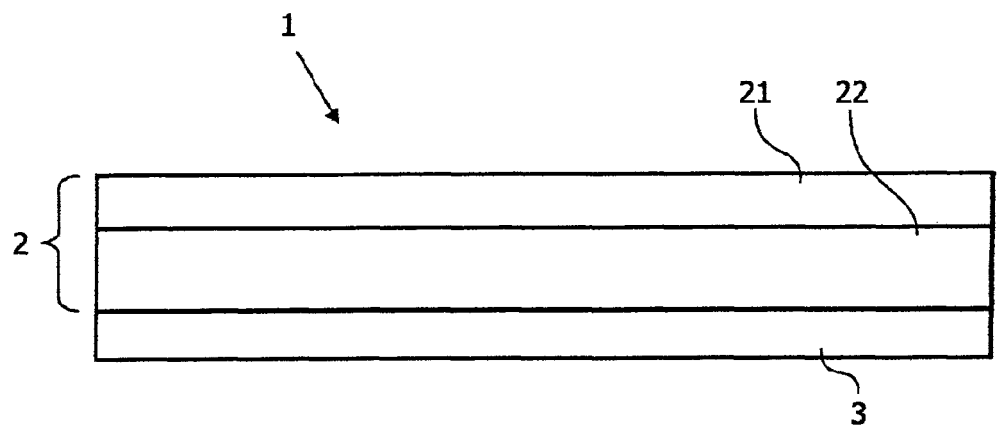
FIG. 1 is a schematic view in section of the construction of a prior art OLED lamp.
Figure 2:
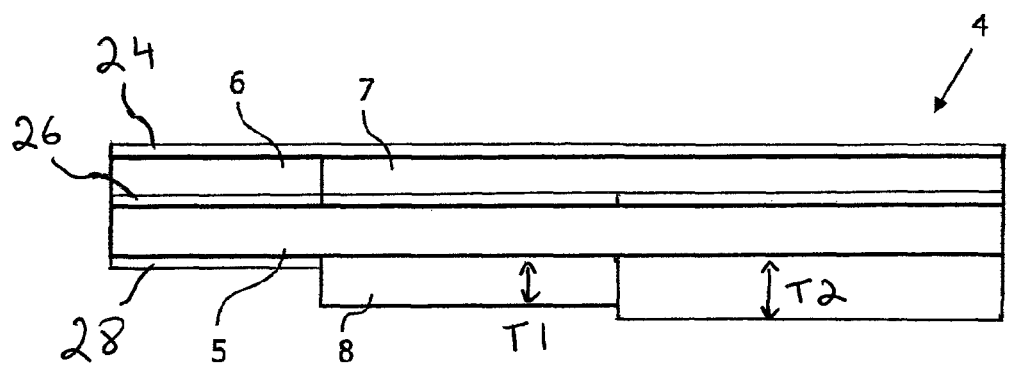
FIG. 2 is a schematic view in section of the construction of an OLED lamp according to the invention.

In FIG. 2 is shown the basic layered construction of an OLED lamp 4 according to the invention. Produced on a glass substrate 5 are electroluminescent layers having regions 6 and 7 that emit in blue and green. Above the substrate 5, looking in the direction in which light is emitted, the green-emitting region of the electroluminescent layer is wholly or partly covered by a red-emitting phosphor layer 8. The red-emitting phosphor layer 8 comprises two regions having different thickness T1, T2, and/or having different phosphor material. The regions that are not covered by the phosphor layer 8 are covered with layer 28 which may be a refractive structure to improve the coupling of light out of the substrate or a layer of scattering particles, such as oxides or sulfides.

Although this is not all shown in FIG. 2, the blue and green-emitting regions 6 and 7 of the OLED each comprise an anode 24, a hole injecting layer, a hole transport layer, an electron injecting layer, an electron transport layer and a cathode 26. The entire sequence of layers, beginning with the ITO cathode 26, is situated on a glass substrate approx. 1 mm thick. In the present case the anode comprises an approximately 140 nm thick layer of indium tin oxide (ITO). All the subsequent layers are applied to the cleaned ITO layer by thermal vapor deposition in a vacuum at a pressure of <10-6 mbar. Dopings are produced in the usual way by the simultaneous vapor deposition of the matrix materials and doping agents. The normal rates of evaporation are determined in this case by quartz devices for measuring layer thickness in the evaporating beam.

In the embodiment shown, the OLED 4 emits through the glass substrate 5. As an alternative, it is however also possible for other substrate materials (e.g. metals) to be used so that the emission takes place in a direction away from the substrate. In this case the phosphor layer would be applied directly to a protective layer that would have to be used and that would be situated on the OLED.

Figure 3:
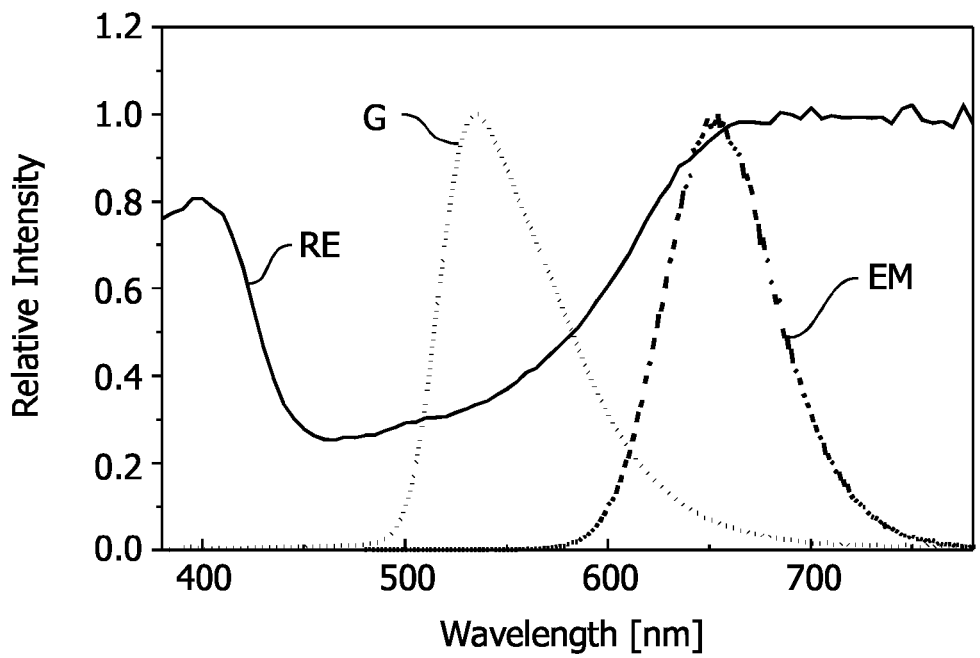
FIG. 3 is a representation of the emission spectrum of a green-emitting OLED having a phosphor layer.

Materials used are:
Hole injecting layer:
M-MTDATA:F4TCNQ.
Thickness=40 nm.
(M-MTDATA)=(4,4',4''-TRIS(N-3-METHYLPHENYL-N-PHENYL-AMINO)-TRIPHEYLAMINE)
(F4TCNQ=2,3,5,6-tetrafluoro-7,7,8,8-tetracyanoquinodimethane) with M-MTDATA
Hole transport layer:
M-MTDATA.
Thickness=10 nm.
Electron transport layer:
TPBI=(1,3,5-TRIS-(1-PHENYL-1H-BENZIMIDIAZOL-2-YL)-BENZENE).
Thickness=50 nm.
Electron injecting layer:
LiF.
Thickness=1 nm.
Green-emitting layer:
TBPI: Irppy8% (Irppy8%=(IR(PHENYLPYRIDINE)2ACAC).
Thickness=15 nm.
Blue-emitting layer:
DPVBI=(4,4'-BIS(2,2-DIPHENYL-ETHEN-1-YL)-DIPHENYL).
Thickness=10 nm.
Suitable phosphors are:
$(Ca_{1-x}Sr_x)S:Eu$
$(Ba_{1-x}Sr_x)_2Si_{5-y}Al_yN_{8-z}O_z:Eu$
$((Ba_{1-x}Ca_x)_2Si_{5-y}Al_yN_{8-z}O_z:Eu$
$Ca_{1-u}Sr_uAlSiN3:Eu$
$0 \leq x \leq 1$
$0 \leq y \leq 5$
$0 \leq z \leq 8$
$0 \leq u \leq 0.1$ Shown in graph form in FIG. 3 is an emission spectrum (dotted line, G) of a green-emitting organic layer of $(ppy)_2Tr(acac)$, together with the reflection spectrum (solid line, RE) of a CaS:Eu phosphor layer and the latter's emission spectrum (dotted and dashed line, EM).

Figure 4:
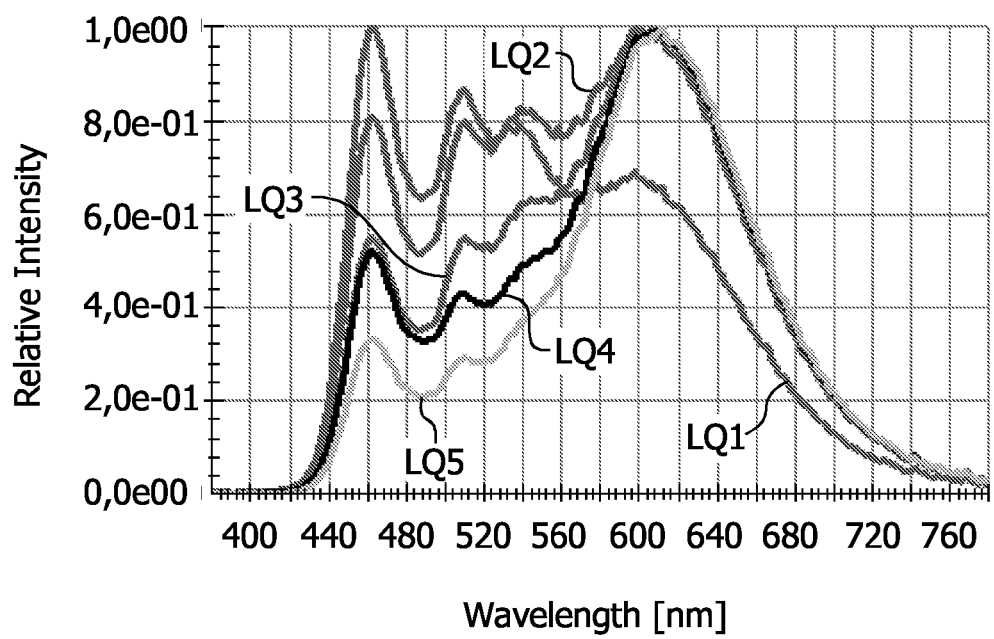
FIG. 4 is a representation of the emission spectrums of OLED lamps LQ1 to LQ5 having different correlated color temperatures.

Shown in FIG. 4 are emission spectrums for various OLED lamps according to the invention (LQ1 to LQ5), namely blue-green (IRPY) OLED's having $Sr_2Si_{5-x}Al_xN_{8-x}O_x:Eu$ (LED4803) phosphor layers having different correlated color temperatures (CCT) as shown in the table (FIG. 4b).

In FIG. 5 is shown, for the OLED lamps LQ1 to LQ5 for which measurements were made, a listing of the correlated color temperatures (CCT) and the color rendering indexes (CRI) as a function of wavelength, from R1 (measurement interval in the blue region of the spectrum) to R14 (measurement interval in the blue region of the spectrum), and of the mean value Ra of the color rendering index over the entire visible spectrum.

The invention claimed is:

1. An organic electroluminescent light source having at least one substrate and a plurality of layers arranged on the substrate, said plurality of layers comprising:
   at least two electrodes of which at least one electrode is transparent and one acts as an anode and one as a cathode;
   at least one organic electroluminescent layer that is arranged between the electrodes, the at least one organic electroluminescent layer having a plurality of regions that emit either blue light or green light, wherein the plurality of regions include a first region that emits the blue light and a second region that emits the green light; and
   at least one phosphor layer that is arranged in the beam path of the light leaving the organic electroluminescent light source and that partly covers the at least one organic electroluminescent layer, wherein the at least one phosphor layer at least partly covers the second region of the at least one organic electroluminescent layer that emits the green light without covering the first region for receiving the green light and not receiving the blue light.

2. The organic electroluminescent light source as claimed in claim 1, wherein the second region that emits the green light of the at least one organic electroluminescent layer contains transition-metal ions having an atomic number Z >50.

3. The organic electroluminescent light source as claimed in claim 1, wherein the second region that emits the green light of the at least one organic electroluminescent layer comprises phosphor particles including iridium III.

4. The organic electroluminescent light source as claimed in claim 3, wherein a mean diameter of the phosphor particles is >200 nm and <20 μm.

5. The organic electroluminescent light source of claim 3, wherein the at least one phosphor layer does not cover the first region of the organic electroluminescent layer that emits the blue light.

6. The organic electroluminescent light source as claimed in claim 1, wherein the at least one phosphor layer comprises phosphors composed of at least one of the materials: $(Ca_{1-x}Sr_x)S:Eu$ ; $(Ba_{1-x}Sr_x)_2Si_{5-y}Al_yN_{8-z}O_z:Eu$ ; $((Ba_{1-x}Ca_x)_2Si_{5-y}Al_yN_{8-z}O_z:Eu$ or $Ca_{1-u}Sr_uAlSiN3:Eu$ where $0 \leq x \leq 1$, $0 \leq y \leq 5$, $0 \leq z \leq 8$, $0 \leq u \leq 0.1$.

7. The organic electroluminescent light source as claimed in claim 1, wherein the organic electroluminescent light source is divided into separately addressable elements.

8. The organic electroluminescent light source as claimed in claim 1, wherein the first region and the second region of the organic electroluminescent light source can be separately driven.

9. The organic electroluminescent light source as claimed in claim 1, wherein the second region is divided into at least two regions that can be separately driven and the at least one phosphor layer includes two layers that cover the at least two regions, wherein the two layers differ in their thickness and/or in phosphor material used.

10. The organic electroluminescent light source as claimed in claim 1, wherein the correlated color temperature can be varied by electrical driving.

11. The organic electroluminescent light source as claimed in claim 1, wherein items of information can be represented and varied by electrical driving.

12. The organic electroluminescent light source as claimed in claim 1, wherein the first region is covered with a refractive structure to improve the coupling of light out of the substrate.

13. The organic electroluminescent light source as claimed in claim 1, wherein the first region is covered with a layer of scattering particles comprising oxides or sulfides.

14. An illumination unit, wherein the illumination unit includes at least one organic electroluminescent light source as claimed in claim 1.

15. The organic electroluminescent light source of claim 1, wherein the second region comprises bis(2-phenylpyridine) iridium(III)acetylacetonate [(ppy)2IR(acac)].

* * * * *